Figure 1:
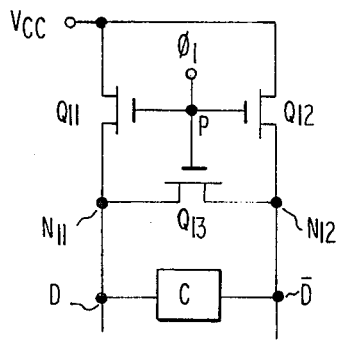

United States Patent [19]
Ozawa et al.

[11] 4,379,344
[45] Apr. 5, 1983

[54] PRECHARGE CIRCUIT

[75] Inventors: Takashi Ozawa; Yasuhiko Nagahashi, both of Tokyo, Japan

[73] Assignee: Nippon Electric Co., Ltd., Tokyo, Japan

[21] Appl. No.: 235,175

[22] Filed: Feb. 17, 1981

[30] Foreign Application Priority Data

Feb. 13, 1980 [JP] Japan ................... 55-16368

[51] Int. Cl.³ ............................................. G11C 7/00
[52] U.S. Cl. .................................... 365/203; 365/190
[58] Field of Search ................ 365/154, 203, 205, 190

[56] References Cited

U.S. PATENT DOCUMENTS 4,077,031  2/1978  Kitagawa et al. ................. 365/203
4,099,265  7/1978  Abe .................................... 365/190

OTHER PUBLICATIONS

Patel, "Precharge for Bootstrap Circuit", IBM Tech. Disc. Bul., vol. 20, No. 7, 12/77, p. 2748 S8744 0114.

Primary Examiner—Stuart N. Hecker
Attorney, Agent, or Firm—Sughrue, Mion, Zinn, Macpeak & Seas

[57] ABSTRACT

A precharge circuit having improved equalizing function and suitable for a high-speed digital circuit is disclosed. The circuit comprises a pair of precharge nodes, an equalizer insulated gate field effect transistor connected between said nodes and means for operatively supplying a gate of the equalizer transistor with a voltager larger than a power supply voltage thereby to operate the equalizer transistor in a triode region.

10 Claims, 7 Drawing Figures

PRECHARGE CIRCUIT

The present invention relates to a precharge circuit for precharging a pair of balanced points up to the same level, and more particularly to a precharge circuit for precharging a data line pair in a memory device.

In a memory device or the like, a circuit construction has been widely employed, in which a pair of data lines connected to a pair of input terminals of a sense amplifier are almost equally charged up to predetermined potentials prior to an activation operation, e.g. a read operation. Subsequently, as a result of selective discharge of the level on one data line in response to the activation operation, a difference signal is produced between the input terminals of the sense amplifier. In such a circuit construction, a D.C. current flowing from a power supply through the data lines and the sense amplifier is not present. Hence operations with low power consumption can be realized. However, in such a circuit construction, since a potential difference applied between the data lines would drive the sense amplifier, the aforementioned precharge must be effected in such manner that the pair of data lines may be charged up to as equal as possible potentials. Nevertheless, it is impossible to expect exactly the same conductance characteristics for the pair of transistors performing precharge of the respective data lines because of fluctuations in manufacture or the like. Consequently, it has been commonly practiced that an equalizer transistor is provided between a pair of data lines and the respective data lines are charged up to the same level by making this equalizer transistor conduct upon precharge.

Recently, following the tendency of semiconductor memory devices becoming to have a high density and low power consumption construction, the operating power supply voltage of the memory devices has become 5 V in place of a conventional standard of 12 V. Therefore, the logic level difference caused by the switching of transistors has been reduced in general, and relatively the influence of the threshold value of the transistors upon logic operations has become large. In more particular, if a potential difference smaller than the threshold voltage of the equalizer transistor should exist between the precharge levels of the respective data lines, it would be difficult to effectively cancel this potential difference. In addition, in the case where the equalizer transistor was formed in small size, it was impossible to obtain a large conductance. Hence it has been difficult to equalize the levels on the respective data lines at a high speed.

It is therefore one object of the present invention to provide a precharge circuit which can charge a pair of data lines up to the same potential.

Another object of the present invention is to provide a precharge circuit which can charge a pair of circuit nodes up to the same potential at a high speed.

Still another object of the present invention is to provide a memory device having a high operation speed and a high sensitivity.

A precharge circuit according to the present invention comprises first and second nodes, a power supply terminal, a first insulated gate field effect transistor connected between the power supply terminal and the first node, a second insulated gate field effect transistor connected between the power supply terminal and the second node, and a third insulated gate field effect transistor connected between the first node and the second node, the first and second nodes being charged by making the first to third transistors conduct with timing signals, which circuit is characterized in that a control signal having a larger magnitude than the potential at the power supply terminal is applied to the gate of the third transistor.

According to the present invention, the third transistor serving as an equalizer transistor is driven in a triode region with a voltage larger than the power supply voltage, and therefore, upon conducting a potential difference between the source and drain of the third transistor is not present. Accordingly, the difference in precharge levels between the first and second nodes can be completely removed. Moreover, the third transistor operating in a triode region has a large conductance, and hence, it can equalize the potentials at the respective nodes at a high speed. In other words, in order to obtain the same conductance the third transistor can be made smaller, and hence it is advantageous for realizing a high density integration of the memory device.

According to the present invention, preferably a signal of the voltage level at the power supply terminal is used as the control signal applied to the gates of the first and second transistor. By making such provision, virtually the conductance of the third transistor can be further increased relatively, and hence the effect as an equalizer transistor for cancelling a level unbalance between two nodes is enhanced.

In addition, according to the present invention, preferably at first the different levels left at the first and second nodes in the preceding activation cycle is quickly equalized by making the third transistor conduct with a control signal larger than the power supply voltage, and subsequently, while maintaining the balance between the first and second nodes through the third transistor, the respective nodes are charged up by making the first and second transistors conduct with a control signal of a voltage close to the power supply voltage.

Here it is to be noted that merely for the purpose of operating the third transistor in a triode region it may be conceived that the threshold value of the third transistor is made smaller than the threshold values of the first and second transistors. However, if such a low threshold value is introduced to the third transistor, the even under the condition where data have been given the third transistor is still conducting to a certain extent, so that the level difference holding characteristics between the respective nodes are poor. Thus data holding over a long period of time becomes impossible. Moreover, forming transistors having different threshold values on the same semiconductor substrate is not favorable because the manufacturing process becomes complexed.

The precharge circuit according to the present invention can be effectively utilized for precharge of a digit line pair in a memory, precharge of an input terminal pair in a sense amplifier, precharge of a data bus pair, precharge of an input node pair in an output amplifier, or the like. Also, it is amplicable to a dynamic type latch circuit or the like.

According to one feature of the present invention, there is provided a precharge device including first and second MISFET's and a third MISFET connected in series between the output terminals of said first and second MISFET's, respectively, in which the respective output terminals of the first and second MISFET's are precharged by applying a first precharge signal to the respective control terminals of the first and second MISFET's and applying a second precharge signal to the control terminal of the third MISFET, and the voltage of the second precharge signal is selected larger in magnitude than the voltage of the first precharge signal.

According to another feature of the present invention, there is provided the above-featured precharge device, in which the voltage of the second precharge signal is larger in magnitude than the sum of a power supply voltage and the threshold voltage of the MISFET's.

The above-mentioned and other features and advantages of the present invention will become more apparent by reference to the following description of one preferred embodiment of the invention taken in conjunction with the accompanying drawings, wherein:

FIG. 1 is a circuit diagram showing a precharge device in the prior art.

Figure 2:
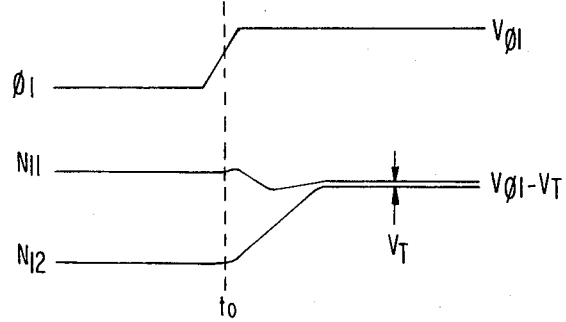
Figure 3:
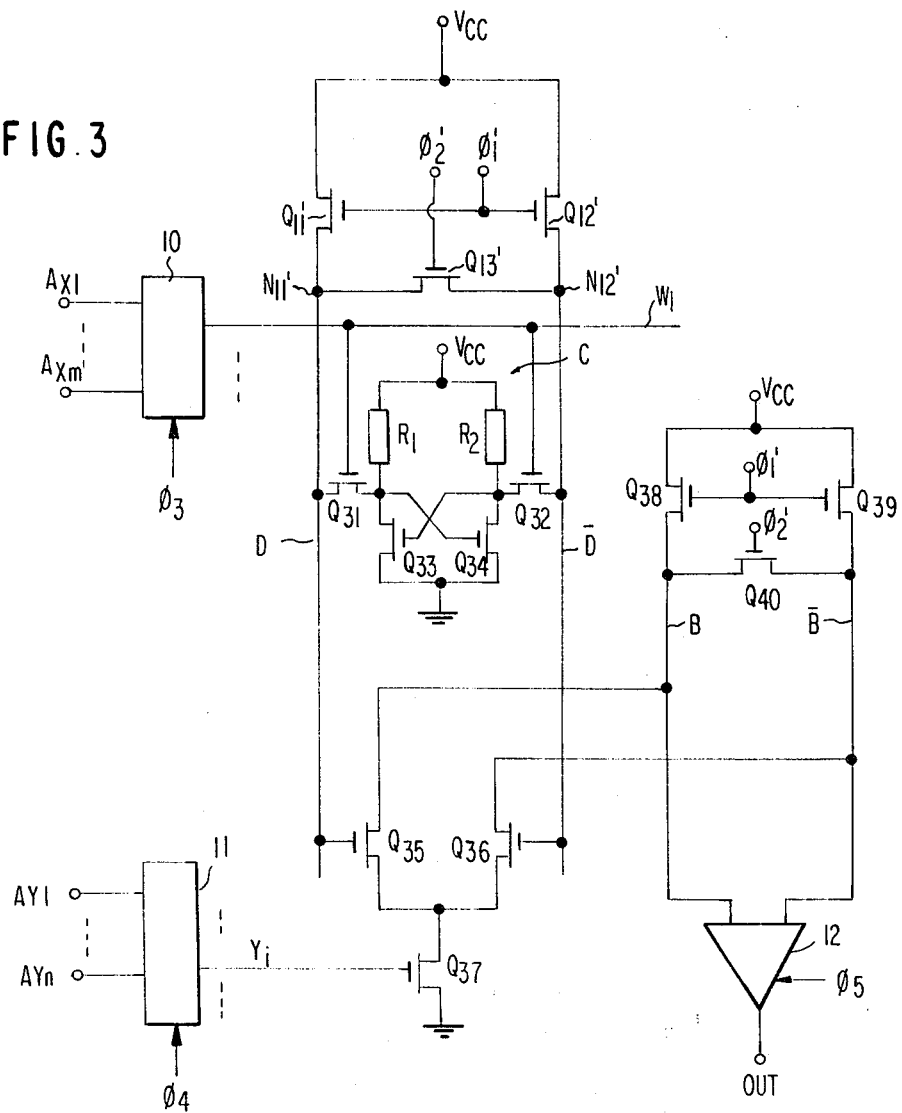
Figure 4:
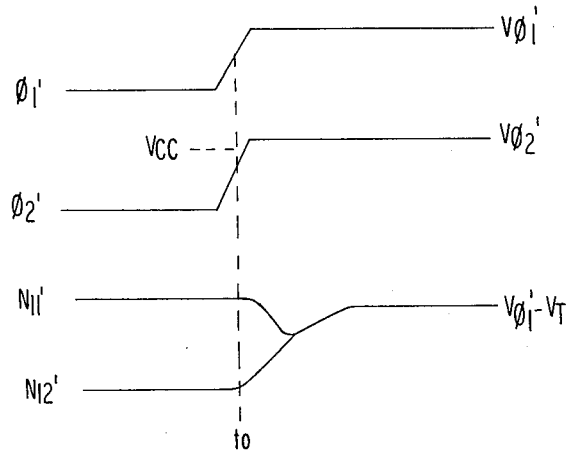
Figure 5:
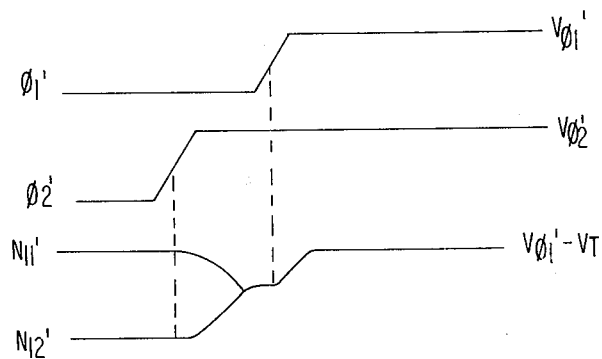
Figure 6:
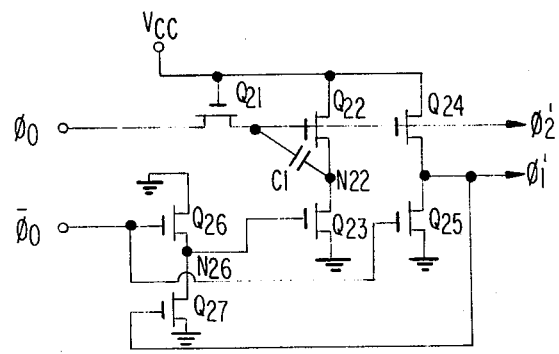
Figure 7:
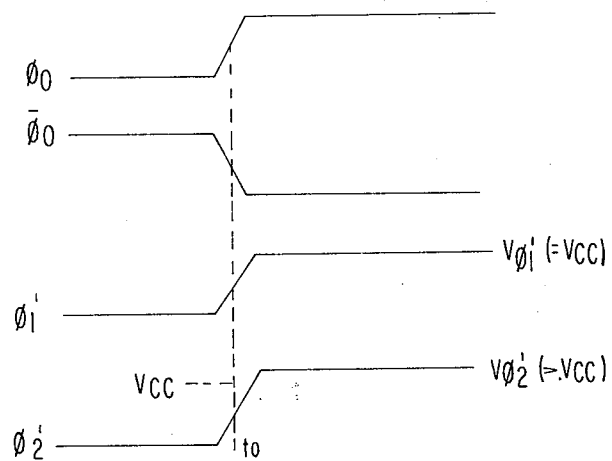

FIG. 2 is a waveform diagram showing waveforms appearing at a number of points in FIG. 1, FIG. 3 is a circuit diagram showing one preferred embodiment of the present inventions, FIG. 4 is a waveform diagram showing one example of waveforms appearing in one mode of operation of the precharge device shown in FIG. 3, FIG. 5 is a waveform diagram showing another example of waveforms appearing in another mode of operation of the precharge device shown in FIG. 3, FIG. 6 shows one example of a precharge signal generator to be used for controlling the precharge device according to the present invention, and FIG. 7 is a waveform diagram showing waveforms appearing at a number of points in FIG. 6.

In the following description, N-channel MISFET's are employed as insulated gate field effect transistors, and a high level corresponds to a logic "1", while a low level corresponds to a logic "0". However, it is to be noted that even in the case of employing P-channel MISFET's, the circuit construction is still exactly the same.

Now a precharge device in the prior art will be explained with reference to FIG. 1.

Gates of MISFET's $Q_{11}$, $Q_{12}$ and $Q_{13}$ are connected to a precharge signal terminal P, the sources of the MISFET's $Q_{11}$ and $Q_{12}$ are used as precharge terminals (hereinafter called simply terminals) $N_{11}$ and $N_{12}$, respectively, and for sample, they are used for precharging a pair of digit lines D and $\overline{D}$ of a memory cell C. The second and third terminals of the MISFET $Q_{13}$ are connected to the terminals $N_{11}$ and $N_{12}$, respectively, and the third terminals of the MISFET's $Q_{11}$ and $Q_{12}$ are connected to a power supply $V_{cc}$. In addition, to the precharge signal terminal P is applied a precharge signal $\phi_1$.

Waveforms appearing at a number of points in the circuit shown in FIG. 1 are illustrated in FIG. 2. Here it is assumed that prior to time $t_o$ the precharge signal $\phi_1$ is at a low level and thus the MISFET's $Q_{11}$, $Q_{12}$ and $Q_{13}$ are in a cut-off condition. Moreover, it is assumed that the terminal $N_{11}$ is at a high level, whereas the terminal $N_{12}$ is at a low level.

If the precharge signal $\phi_1$ changes to a high level $V_{\phi 1}$ at time $t_o$, then the MISFET's $Q_{11}$, $Q_{12}$ and $Q_{13}$ become conducting, so that the terminals $N_{11}$ and $N_{12}$ are charged up to $V_{\phi 1}-V_T$ (where $V_T$ is the threshold value of the MISFET's, and it is assumed that $V_{\phi 1}-V_T \leq V_{CC}$ and $V_T \geq 0$ are satisfied). However, in the case where only the threshold value of the MISFET $Q_{12}$ is lower, for example, by 0.1 V then the threshold values of the other MISFET's, the precharge level at the terminal $N_{12}$ would become higher by 0.1 V than the precharge level at the terminal $N_{11}$, and therefore, there exists a shortcoming that an unbalanced state would remain.

Next, the preferred embodiment of the present invention as applied to a memory device will be described with reference to FIG. 3. In this memory device, a memory cell C is composed of cross-coupled MISFET's $Q_{33}$ and $Q_{34}$ at their gates and drains, a pair of transfer gate MISFET's $Q_{31}$ and $Q_{32}$ and a pair of load elements $R_1$ and $R_2$. Gates of MISFET's $Q_{31}$ and $Q_{32}$ are connected to a word line $W_1$ connected to a row decoder 10 receiving row address signals $A_{x1}$-$A_{xm}$. A true digit line D and a complement digit line $\overline{D}$ are coupled to drains or sources of MISFET's $Q_{31}$ and $Q_{32}$. MISFET's $Q_{35}$, $Q_{36}$ and $Q_{37}$ form a gated type sense amplifier with a true and a complement read bus lines B and $\overline{B}$ and common precharge MISFET's $Q_{38}$, $Q_{39}$ and $Q_{40}$ which are common for other columns. The gated type sense amplifier enabled by a column selection signal $Y_i$ derived from a column decoder 11 receiving column address signals $A_{y1}$-$A_{yn}$.

The true and complement read bus lines B and $\overline{B}$ are coupled to a pair of input terminals of an output amplifier 12. In this memory device, the true and complement digit lines are operatively precharged by MISFET's $Q_{11}'$, $Q_{12}'$ and $Q_{13}'$ as explained in below.

Also, MISFET's $Q_{38}$ to $Q_{40}$ operatively charge the bus lines B and $\overline{B}$. A first and a second precharge signals $\phi_1'$ and $\phi_2'$ are turned to a high level in a reset precharge period. Timing signals $\phi_3$, $\phi_4$ and $\phi_5$ are sequentially turned to a high level in activation period after the reset precharge period. Among the these signals, only the signal $\phi_2'$ takes a voltager larger than the power voltage $V_{cc}$ at it high level while the rest take $V_{cc}$ level at their high level. In this circuit illustrated in FIG. 3, gates of MISFET's $Q_{11}'$ and $Q_{12}'$ are applied with the first precharge signal $\phi_1'$, and a gate of a MISFET's $Q_{13}'$ is applied with the second precharge signal $\phi_2'$. Sources of MISFET's $Q_{11}'$ and $Q_{12}'$ are connected to nodes $N_{11}'$ and $N_{12}'$, respectively, while a drain and a source of MISFET $Q_{13}'$ are connected to the nodes $N_{11}'$ and $N_{12}'$, respectively. Drains of the MISFET's $Q_{11}'$ and $Q_{12}'$ are connected to a power supply $V_{cc}$. Here, the precharge signals $\phi_1'$ and $\phi_2'$ fulfil the relations characteristic characteristic of the present invention of $V_{\phi 2'} > V_{\phi 1'}$ and $V_{\phi 2'} > V_{cc}$.

In FIG. 4 is shown one example of waveforms appearing at a number of points in the preferred embodiment of the present invention illustrated in FIG. 3. It is assumed that prior to time $t_o$ the precharge signals $\phi_1'$ and $\phi_2'$ are held at a low level, and hence MISFET's $Q_{11}'$, $Q_{12}'$ and $Q_{13}'$ are in a cut-off condition. Moreover, it is assumed here that the node $N_{11}'$ is held at a high level, whereas the node $N_{12}'$ is held at a low level. If the precharge signals $\phi_1'$ and $\phi_2'$ change to their high levels $V_{\phi 1'}$ and $V_{\phi 2'}$, respectively, then MISFET's $Q_{11}'$, $Q_{12}'$ and $Q_{13}'$ become conducting, so that the nodes $N_{11}'$ and $N_{12}'$ are charged up to $V_{\phi 1'}-V_T$, where $V_T$ represents the threshold value of MISFET's $Q_{11}'$, $Q_{12}'$ and $Q_{13}'$, and similarly to the prior art the relations $V_{\phi 1'}-V_T \leq V_{cc}$ and $V_T \geq 0$ are fulfilled.

When the nodes $N_{11}'$ and $N_{12}'$ have been charged up to $V_{\phi 1'}-V_T$, MISFET's $Q_{11}'$ and $Q_{12}'$ both become a cut-off condition, but MISFET $Q_{13}'$ maintains a conducting condition because its gate voltage $V_{\phi 2'}$ is higher than $V_{\phi 1}'$. Accordingly, the difference in precharge levels produced between the nodes $N_{11}'$ and $N_{12}'$ is quickly eliminated. Since the MISFET $Q_{13}'$ continues to conduct until both of the nodes $N_{11}'$ and $N_{12}'$ become $V_{\phi 2} - V_T$, even in the case where the unbalance in the threshold value $V_T$ between MISFET's $Q_{11}'$ and $Q_{12}'$ amounts to $\Delta V_T$ as described above, it is only necessary to select the values of $V_{\phi 2}'$ and $V_{\phi 1}'$ so as to fulfil the relation of $V_{\phi 2}' - V_{\phi 1}' > \Delta V_T$.

However, in the case where the precharge device having the above-described construction is used with a power supply voltage especially selected at a several volts, even if the unbalance in the precharge levels is eliminated, sometimes the precharge device becomes unavailable because of the fact that the precharge level itself is too low. Therefore, according to one feature of the present invention it is possible to select at least the level $V_{\phi 1}'$ close to or higher than the power supply level by raising the $V_{\phi 2}'$ higher than the power supply level $V_{cc}$, and thereby the precharge level can be made equal to or higher than $V_{cc} - V_T$. For instance, if it is assumed that $V_{cc}$ is 4.5 V and $V_T$ is 1 V, then the precharge level becomes about 3.5 V, which is available in a TTL circuit arrangement. Though the operation has been explained on the digit lines D and $\overline{D}$, it is apparent that the operations at the bus lines B and $\overline{B}$ are substantially similar. Here, though the drains of the transistors $Q_{11}'$ and $Q_{12}'$ connected to the $V_{cc}$ in the above explanation, it is apparent that a pulse wave voltage, e.g. $\phi_1'$ may be used in place of $V_{cc}$ for this purpose.

Now another mode of operation of the precharge device according to the present invention illustrated in FIG. 3 will be explained with reference to the waveform diagram shown in FIG. 5. In this mode of operation, at first the precharge signal $\phi_2'$ is changed from a 0 level to $V_{cc} + \alpha$, where $\alpha$ is a value larger than the threshold value of MISFET $Q_{13}'$. By such change of the precharge signal $\phi_2'$, the different levels remaining at the nodes $N_{11}'$ and $N_{12}'$ since the preceding cycle can be equalized. Subsequently, MISFET's $Q_{11}'$ and $Q_{12}'$ are made conducting by charging the precharge signal $\phi_1'$ from a 0 level to a $V_{cc}$ level, and thereby the nodes $N_{11}'$ and $N_{12}'$ are charged up to the level of about $V_{cc} - V_T$ by maintaining a balance between these terminals.

One example of a practical circuit for obtaining the precharge signals $V_{\phi 1}'$ and $V_{\phi 2}'$ is illustrated in FIG. 6. In this figure, a first terminal of a MISFET $Q_{21}$ is connected to a power supply $V_{cc}$, a second terminal thereof is applied with one of input signals for this circuit $\phi_0$, and a third terminal thereof is connected to an output terminal for the precharge signal $\phi_2'$. MISFET's $Q_{22}$ and $Q_{23}$ form an inverter, in which the first terminal of the MISFET $Q_{22}$ is connected to the output terminal for the precharge signal $\phi_2'$. In addition, between an output terminal $N_{22}$ of this inverter and the output terminal for the precharge signal $\phi_2'$ is connected a bootstrap capacitor $C_1$. MISFET's $Q_{24}$ and $Q_{25}$ jointly form another inverter, the first terminal of the MISFET $Q_{24}$ is connected to the output terminal for the precharge signal $\phi_2'$, and the first terminal of MISFET $Q_{25}$ is applied with an input signal $\overline{\phi_0}$ which is a signal derived by inverting the input signal $\phi_0$. The output terminal of this inverter serves as an output terminal for the precharge signal $\phi_1$. MISFET's $Q_{26}$ and $Q_{27}$ jointly form still another inverter, in which the first terminal of MISFET $Q_{26}$ is applied with the input signal $\phi_0$, the first terminal of MISFET $Q_{27}$ is applied with the output signal $\phi_1'$, and an output terminal $N_{26}$ of this inverter is connected to the first terminal of MISFET $Q_{23}$.

Waveforms appearing in this circuit are illustrated in FIG. 7. If the input signal $\phi_0$ is inverted from a low level to a high level and the input signal $\overline{\phi_0}$ is inverted from a high level to a low level at time $t_0$, the output signals $\phi_2'$ and $\phi_1'$ begin to rise in level gradually from a low level towards a high level. When the voltage of the output signal $\phi_1'$ exceeds the level of the threshold value $V_T$ of MISFET $Q_{27}$, the charge at the inverter output terminal $N_{26}$ is discharged, and when the level of the output terminal $N_{26}$ is lowered below the level of the threshold value $V_T$ of MISFET $Q_{23}$, the bootstrap circuit begins to operate, so that by selecting the capacitance of the bootstrap capacitor $C_1$ at an appropriate value it is possible to raise the output signal voltage $V_{\phi 2}'$ higher than the power supply level $V_{cc}$ and to raise the output signal voltage $V_{\phi 1}'$, in the case of the illustrated circuit, at the maximum up to the power supply level $V_{cc}$.

In addition, according to one preferred mode of embodiment of the present invention, in FIG. 3 by raising both the first precharge signal $\phi_1'$ and the second precharge signal $\phi_2'$ higher than the sum of the power supply voltage $V_{cc}$ and the threshold value $V_T$ of MISFET's $Q_{11}'$, $Q_{12}'$ and $Q_{13}'$, it is possible to maintain MISFET's $Q_{11}'$, $Q_{12}'$ and $Q_{13}'$ is a conducting condition throughout the precharge period for eliminating the precharge level difference between the precharge nodes $N_{11}'$ and $N_{12}'$.

As described in detail above, according to the present invention, a precharge circuit which can afford charged levels with little unbalance between a pair of terminals, can be easily provided.

I claim:

1. A circuit comprising a first and a second nodes, a power supply terminal receiving a power voltage, a first and a second insulated gate field effect transistors connected between said first and second nodes and said power supply terminal respectively, a third insulated gate field effect transistor connected between said first and second nodes, first control means for generating a first control signal, means for supplying said first control signal to gates of said first and second transistors, second control means for generating a second control signal having a voltage value larger than said power voltage in absolute value, and means for supplying said second control signal to a gate of said third transistor.

2. The circuit according to claim 1, in which said second control signal is larger than said power voltage by at least a threshold voltage of said third transistor.

3. The circuit according to claim 1, further comprising data means for operatively generating a voltage difference between said first and second nodes.

4. The circuit according to claim 1, in which said second control signal is activated before an activation of said first control signal.

5. The circuit according to claim 1, in which said first control signal takes said power voltage.

6. In a circuit including a first and a second data nodes, a voltage source of a first voltage, a first insulated gate field effect transistor coupled between said first node and said voltage source, a second insulated gate field effect transistor coupled between said second node and said voltage source, and a third insulated gate field effect transistor connected between said first and second nodes, said first to third transistors being made conductive in a precharge period thereby to precharge said first and second nodes, the improvement comprises means for operatively supplying a gate of said third transistor with a second voltage, an absolute value of said second voltage being larger than that of said first voltage.

7. The circuit according to claim 6, further comprising means for selectively discharging a charged voltage at either of said first and second node after said precharge period.

8. The circuit according to claim 6, in which said supplying means includes a boot-strap circuit.

9. The circuit according to claim 6, further comprising a differential amplifier having a first and a second input terminals, first means for connecting said first input terminal to said first node, and second means for connecting said second input terminal to said second node.

10. A device comprising a plurality of memory cells, a plurality of word lines, a plurality of digit line pairs, each of said digit line pairs including a first and a second digit lines, a plurality of sense amplifiers provided for each of said digit line pairs, each of said sense amplifiers including a first input terminal receivable a signal from said first digit line and a second input terminal receivable a signal from said second digit line, a voltage terminal for receiving a first voltage, a plurality of first insulated gate field effect transistor connected between said voltage terminal and said first digit line, a plurality of second insulated gate field effect transistor connected between said voltage terminal and said second digit lines, a plurality of third insulated gate field effect transistor connected between said first and second digit line in each of said digit line pairs, first means for operatively generating a first control signal having the substantially same voltage as said first voltage, second means for supplying gates of said first transistors with said first control signal, third means for operatively generating a second control signal having a voltage larger than said first voltage in absolute value, and fourth means for supplying gates of said third transistors with said second control signal.

* * * * *